United States Patent
Wang

[11] Patent Number: 6,051,986
[45] Date of Patent: Apr. 18, 2000

[54] METHOD OF TESTING A TRANSISTOR

[75] Inventor: Mu-Chun Wang, Hsinchu, Taiwan

[73] Assignee: United Microelectronics Corp., Taiwan

[21] Appl. No.: 08/999,236

[22] Filed: Dec. 29, 1997

[30] Foreign Application Priority Data

Oct. 27, 1997 [TW] Taiwan ................................ 86115835

[51] Int. Cl.[7] .................................................. G01R 31/26
[52] U.S. Cl. ........................................................ 324/769
[58] Field of Search ........................... 324/769; 438/162; 257/281, 347

[56] References Cited

U.S. PATENT DOCUMENTS

| | | | |
|---|---|---|---|
| 4,053,916 | 10/1977 | Cricchi et al. | 357/23 |
| 4,680,810 | 7/1987 | Swartz | 455/609 |
| 4,795,976 | 1/1989 | Pawlik | 324/767 |
| 4,979,014 | 12/1990 | Heida et al. | 357/56 |
| 5,420,055 | 5/1995 | Vu et al. | 438/162 |
| 5,767,549 | 6/1998 | Chen et al. | 257/347 |
| 5,821,575 | 10/1998 | Mistry et al. | 257/281 |

*Primary Examiner*—Josie Ballato
*Assistant Examiner*—T. R. Sundaram
*Attorney, Agent, or Firm*—Rabin & Champagne, P.C.

[57] ABSTRACT

A method of testing for a kink effect typically occurring during the fabrication of shallow trench isolation of a transistor in an integrated circuit. A curve of source/drain current versus gate voltage is plotted. A second order differential of the curve is performed and plotted, and the existence of a kink effect is determined by the number of the local maxima and local minima. The degree of kink effect as low as and below a 0.25 $\mu$m level is determined according to the level of a global minimum value.

7 Claims, 2 Drawing Sheets

METHOD OF TESTING A TRANSISTOR

BACKGROUND OF THE INVENTION

1. Field of the Invention

The invention relates in general to a method of testing a transistor, and more particularly to a method of testing a kink effect of a transistor.

2. Description of the Related Art

During the fabrication of an integrated circuit (IC), a kink effect usually occurs during the formation of shallow trench isolation. Hydrogen fluoride is usually utilized to etch away the undesired silicon oxide but it also damages the field region. The damaged field region therefore is unable to isolate the adjacent conductive layers completely. Consequently, a sub-threshold current arises, which strongly effects the quality of the ICs. This is what is known as the kink effect. Kink effect testing is therefore necessary during IC fabrication.

Referring to FIG. 1A, a schematic top view of a transistor, the source/drain regions 100a and 100b are located at two sides of the polysilicon gate 102a, and the contact window 104 is formed for connecting the 20 source/drain region and other transistors. When no kink effect exists, the width of the polysilicon gate 102a remains uniform, the current is steady and sub-threshold current is eliminated.

However, if the polysilicon gate 102b is damaged, as shown in FIG. 1B, and has a varied width, the threshold current becomes unstable. It is proposed that a pseudo-transistor B be formed, and have a different threshold voltage from the original transistor A. Therefore, the undesired kink effect occurs due to the existence of the pseudo-transistor B.

Referring to FIG. 1B, the width of the polysilicon gate of the transistor A is assumed to be L and that of the pseudo-transistor B is assumed to be L'. If L is equal to L', the threshold is steady, which indicates that the quality of the transistor is high. If L is larger than L', the pseudo-transistor B turns on before the original transistor A, which results in a lower sub-threshold current. In contrast, if L is smaller than L', the dielectric effect of the transistor A is reduced, the transistor A turns on earlier than the pseudo-transistor B and, consequently, leakage current appears. To sum up, it is apparent that if the whole transistor has an unequal polysilicon gate width, it is poor in quality.

The conventional method for testing for the existence of a kink effect includes providing the gate with a gate voltage Vg to obtain a corresponding source/drain current Ids, and drawing a curve as a function of the source/drain current versus gate voltage (Ids–Vg). Referring to FIG. 2B, curve 206 is obtained from a transistor with a kink effect and curve 208 is obtained from a transistor without a kink effect. It is shown that the curve 208 of the ideal transistor has only one turning point, while the curve 206 includes more than one turning point. This result is then used to determine the existence of kink effect. However, this conventional testing method can be used for qualitative analysis but not for quantitative analysis, and the degree of the kink effect cannot be found by this method. Moreover, this method cannot be used at the 0.25 μm level.

SUMMARY OF THE INVENTION

It is therefore an object of the invention to provide a method for testing the degree of a kink effect of a transistor.

It is therefore another object of the invention to provide a method for testing a kink effect of a transistor, which method takes less time and labor.

It is therefore a further object of the invention to provide a method for testing a kink effect of a transistor at or below the 0.25 μm level.

According to the objects of the invention, a method for testing a kink effect is provided. This method includes a second order differential Ids–Vg curve and determines the existence of a kink effect by the number of the local maxima and local minima. This method takes less time and labor than the conventional method and is also able to determine the degree of kink effect at or below the 0.25 μm level.

BRIEF DESCRIPTION OF THE DRAWINGS OF THE DRAWINGS

Other objects, features, and advantages of the invention will become apparent from the following detailed description of the preferred but non-limiting embodiments. The description is made with reference to the accompanying drawings of the preferred but non-limiting embodiments. The description is made with reference to the accompanying drawings in which.

DESCRIPTION OF THE PREFERRED EMBODIMENT

Figure 1A:
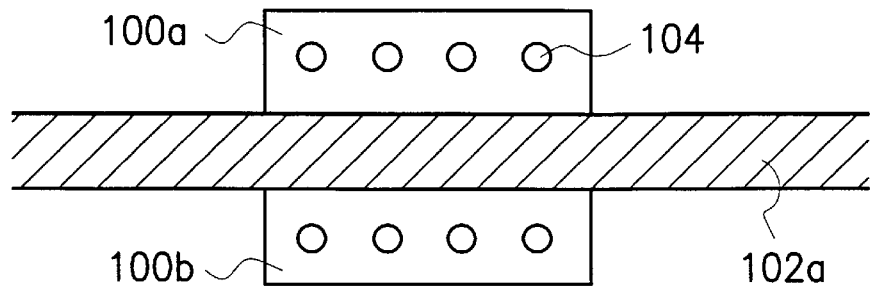
FIG. 1A is a schematic top view of an ideal transistor.
Figure 1B:
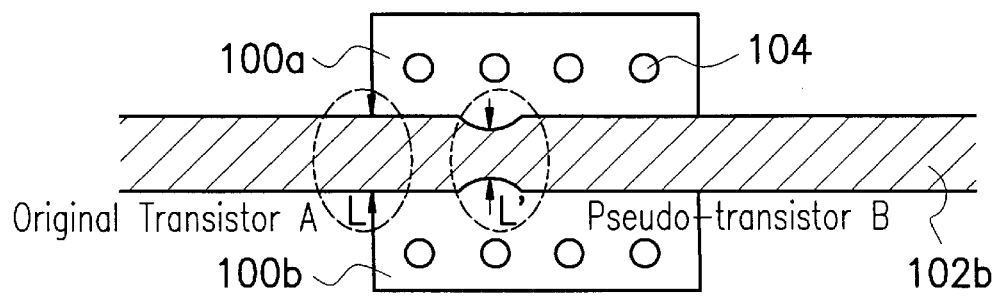
FIG. 1B is a schematic top view of a transistor with a kink effect.
Figure 1C:
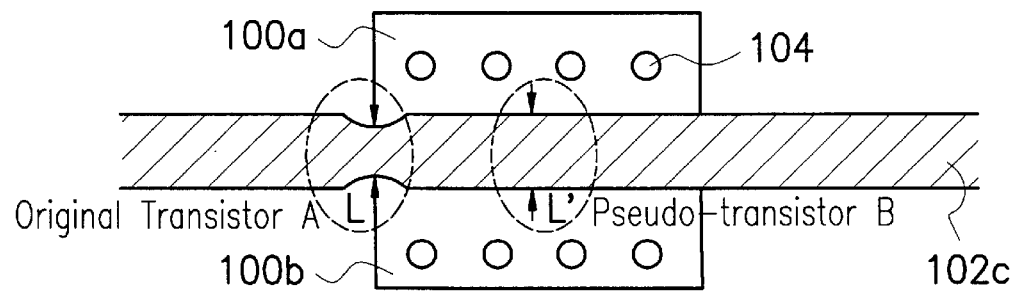
FIG. 1C is a schematic top view of another transistor with a kink effect.
Figure 2A:
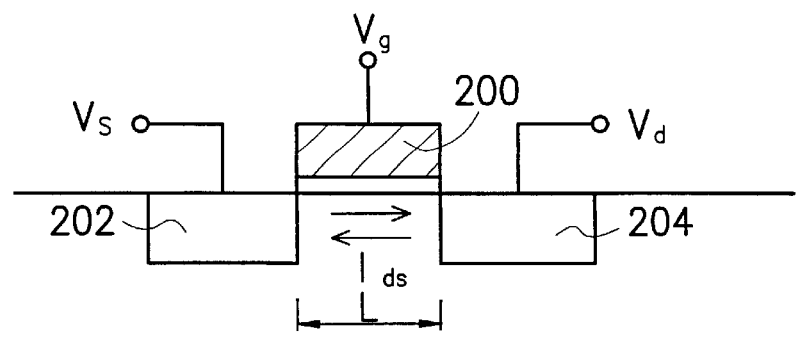
FIG. 2A is a schematic, cross-sectional view showing a transistor.

FIG. 2A shows a cross section of a transistor, which includes a polysilicon gate 200, a source region 202 and a drain region 204. An adjustable DC bias voltage is provided between the source region 202 and the drain region 204. The source region 202 and the substrate are then grounded. Vg represents the gate voltage, Vs represents the source voltage, and Vd represents the drain voltage. When the gate voltage Vg rises to a certain level, a source/drain region current Ids starts to flow between the source and drain regions. The source/drain region current Ids is proportional to the drain voltage Vd versus source voltage Vs. For a transistor without a kink effect, the source/drain region current Ids is a function of gate voltage Vg. The curve of the source/drain region current Ids versus gate voltage Vg has only one turning point for a transistor without a kink effect. Moreover, the second order differential curve of the source/drain region current Ids versus gate voltage Vg has only one local minimum point for an ideal transistor. This second order differential curve can determine the kink effect of a transistor, even at or below the 0.25 μm level.

Figure 2B:
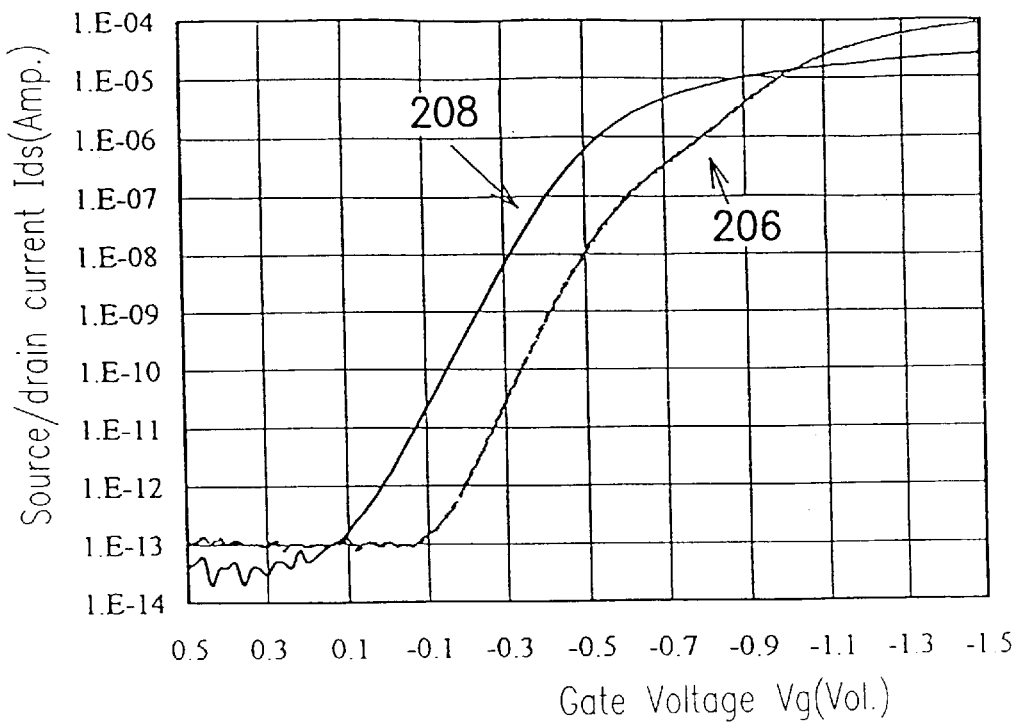
FIG. 2B shows the conventional Ids–Vg curve for determining a kink effect.
Figure 2C:
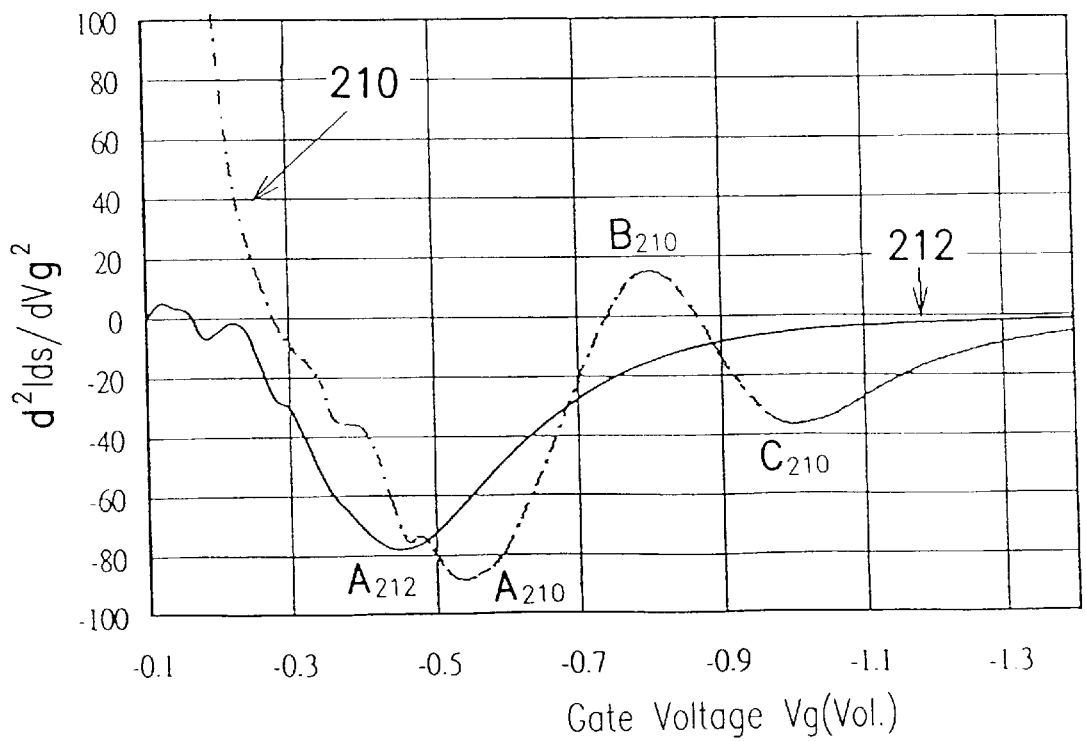
FIG. 2C shows the second order differential curve of source/drain current versus gate voltage for determining a kink effect according to this invention.

A gate voltage Vg is first provided to the gate to obtain a measurement current Ids, while drain voltage Vd and source voltage Vs are constant. This step is repeated by providing different gate voltages a number of times, to produce a curve of Vg versus Ids. As shown in FIG. 2B, the curve 208 of an ideal transistor and the curve 206 of a transistor with kink effect, are shown with Vg along an x-axis and Ids along a y-axis. Moreover, at least in a certain range, the source/drain current Ids is second order differentiated by the corresponding gate voltage Vg to further obtain a plot of $d^2Ids/dVg^2$ versus Vg, measuring the gate voltage Vg along the x-axis and measuring $d^2Ids/dVg^2$ along the y-axis. The second differential plot 212 of a transistor without kink effect has a global minimum $A_{212}$ and finally, the value of $d^2Ids/dVg^2$ tends toward zero. On the other hand, the second differential plot 210 of a transistor with kink effect has a first local minimum $A_{210}$, a first local maximum $B_{210}$ and a local second minimum $C_{210}$. The value of the first local minimum $A_{210}$ is always lower than that of the global minimum $A_{212}$ of an ideal transistor. The existence of the kink effect is determined by the number of maxima and minima. The degree of kink effect is determined by how greatly the two global minima, respectively of the ideal plot and the experimental plot, differ.

By applying the testing method of this invention, the existence of a kink effect of a transistor at or below the 0.25 μm level can be precisely detected, which is not possible with the conventional method.

Moreover, the testing method is able to determine the degree of kink effect by quantitative analysis, which is also not possible with the conventional method.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of testing a transistor, which is used to test for existence of a kink effect, comprising the steps of:

providing a gate voltage Vg to said transistor to obtain a source/drain current Ids;

differentiating said obtained source/drain current Ids by said gate voltage Vg to obtain a plot of $d^2Ids/dVg^2$ versus Vg; and determining the existence of the kink effect, wherein if said plot of $d^2Ids/dVq^2$ versus Vg has one global minimum, no kink effect exists, and if said plot of $d^2Ids/dVg^2$ versus Vg has more than one global minimum, said transistor has a kink effect.

2. A method of testing a transistor as claimed in claim 1, wherein a more serious kink effect has a lower global minimum value for said plot of $d^2Ids/dVg^2$ versus Vg.

3. A method of testing a transistor, which is used to test for existence of a kink effect, wherein the transistor comprises a source region, a drain region, and a gate and is formed on a substrate, comprising the steps of:

providing an adjustable DC bias voltage between said source region and said drain region and grounding said source region and said substrate;

providing a gate voltage Vg to said gate to produce a current I; drawing a first plot of said gate voltage Vg versus said current I; differentiating said current I by said gate voltage Vg to obtain a second plot of $d^2Ids/dVg^2$ versus Vg; and determining the existence of the kink effect, wherein if said plot of $d^2Ids/dVg^2$ versus Vg has one global minimum, no kink effect exists, and if said plot of $d^2Ids/dVq^2$ versus Vg has more than one global minimum, said transistor has a kink effect.

4. A method of testing a transistor as claimed in claim 3, wherein said current I is a source/drain current.

5. A method of testing a transistor as claimed in claim 3, wherein a more serious kink effect has a lower global minimum value for said plot of $d^2Ids/dVg^2$ versus Vg.

6. A method of testing a transistor as claimed in claim 3, wherein said determining the existence of a kink effect includes detecting the existence of a kink effect of a transistor below a 0.25 μm level.

7. A method of testing a transistor as claimed in claim 1, wherein said determining the existence of a kink effect includes detecting the existence of a kink effect of a transistor below a 0.25 μm level.

* * * * *